(12) United States Patent
Sakurai et al.

(10) Patent No.: US 9,109,280 B2
(45) Date of Patent: Aug. 18, 2015

(54) HARD LAMINAR COATING

(75) Inventors: Masatoshi Sakurai, Toyokawa (JP);
Toshihiro Ohchi, Toyokawa (JP)

(73) Assignee: OSG CORPORATION, Toyokawa-Shi (JP)

( * ) Notice: Subject to any disclaimer, the term of this patent is extended or adjusted under 35 U.S.C. 154(b) by 15 days.

(21) Appl. No.: 13/982,860

(22) PCT Filed: Feb. 1, 2011

(86) PCT No.: PCT/JP2011/052069
§ 371 (c)(1),
(2), (4) Date: Jul. 31, 2013

(87) PCT Pub. No.: WO2012/105003
PCT Pub. Date: Aug. 9, 2012

(65) Prior Publication Data
US 2013/0309469 A1  Nov. 21, 2013

(51) Int. Cl.
*B23B 27/14* (2006.01)
*C23C 14/14* (2006.01)
*C23C 14/06* (2006.01)
*C23C 28/04* (2006.01)
*C23C 28/00* (2006.01)

(52) U.S. Cl.
CPC ............... *C23C 14/14* (2013.01); *C23C 14/06* (2013.01); *C23C 14/067* (2013.01); *C23C 28/044* (2013.01); *C23C 28/42* (2013.01); *Y10T 428/24975* (2015.01)

(58) Field of Classification Search
USPC ............ 51/307, 309; 428/216, 336, 697, 698, 428/699, 704
See application file for complete search history.

(56) References Cited

U.S. PATENT DOCUMENTS

| | | | | |
|---|---|---|---|---|
| 4,268,582 A | * | 5/1981 | Hale et al. | 428/698 |
| 4,619,865 A | * | 10/1986 | Keem et al. | 428/699 |
| 6,287,711 B1 | * | 9/2001 | Nieh et al. | 428/697 |
| 6,770,358 B2 | * | 8/2004 | Berger et al. | 51/309 |
| 7,226,670 B2 | * | 6/2007 | Derflinger et al. | 428/697 |

(Continued)

FOREIGN PATENT DOCUMENTS

| | | | |
|---|---|---|---|
| CN | 101090790 A | | 12/2007 |
| CN | 101214744 | * | 7/2008 |

(Continued)

OTHER PUBLICATIONS

International Search Report issued in International Patent Application No. PCT/JP2011/052069 dated Mar. 15, 2011.

(Continued)

*Primary Examiner* — Archene Turner
(74) *Attorney, Agent, or Firm* — Oliff PLC

(57) ABSTRACT

A hard laminar coating having a first 61 m and a second film having respective different compositions and alternately laminated on a surface of a base structure, wherein the first film is a carbide, a nitride, a carboxide, a nitroxide, a carbonitride or a carbo-oxynitride of $(Al_aCr_bB_c)$, while the second film is $TiB_2$, the hard laminar coating configured to include atomic ratios a, b and c in the first film satisfying $a=1-b-c$, $0.2 \leq b \leq 0.7$, and $0 < c \leq 0.2$, and a thickness of the first film being no less than 0.1 μm and no more than 5.0 μm, while a thickness of the second film being no less than 0.1 μm and no more than 5.0 μm, and to have a total thickness of no less than 0.2 μm and no more than 10.0 μm, and the hard laminar.

1 Claim, 5 Drawing Sheets

(56) References Cited

U.S. PATENT DOCUMENTS

| | | | |
|---|---|---|---|
| 8,388,709 B2 * | 3/2013 | Wallgram et al. ............... 51/307 |
| 2003/0039867 A1 | 2/2003 | Berger et al. |
| 2004/0214033 A1 | 10/2004 | Berger et al. |
| 2005/0170162 A1 | 8/2005 | Yamamoto et al. |
| 2007/0269610 A1 | 11/2007 | Fukui et al. |
| 2007/0278090 A1 | 12/2007 | Yamamoto et al. |

FOREIGN PATENT DOCUMENTS

| | | | |
|---|---|---|---|
| JP | A-7-205361 | | 8/1995 |
| JP | 09-041127 | * | 2/1997 |
| JP | A-2002-355704 | | 12/2002 |
| JP | A-2003-291007 | | 10/2003 |
| JP | A-2005-256081 | | 9/2005 |
| JP | 2005-330539 | * | 12/2005 |
| JP | A-2008-105106 | | 5/2008 |
| JP | 2008-238281 | * | 10/2008 |
| JP | A-2010-99735 | | 5/2010 |

OTHER PUBLICATIONS

Nov. 28, 2014 Office Action issued in Korean Application No. 2013-7022876.

Office Action issued in Chinese Application No. 201180066524.5 mailed on Aug. 27, 2014 (with partial translation).

Apr. 15, 2015 Office Action issued in Chinese Application No. 201180066524.5.

* cited by examiner

FIG.9

| TEST SAMPLES: TWO-CUTTING-EDGES END MILL φ6 | | | | | | | | |
|---|---|---|---|---|---|---|---|---|
| WORKPIECE | MACHINE TOOL | | CUTTING SPEED | FEED RATE | MILLING DEPTH | | | CUTTING FLUID |
| Inconel718 | VERTICAL. M/C | | 29m/min | 0.02mm/EDGE | 0.3mm | | | OIL |

| TEST SAMPLES | LOWERMOST LAYER | UPPERMOST LAYER | FILM A | FILM B | THICKNESS (μm) FILM A | THICKNESS (μm) FILM B | TOTAL THICKNESS (μm) | NUMBER OF FILMS | MILLING DISTANCE REMARK 1 | EVALUATION REMARK 2 |
|---|---|---|---|---|---|---|---|---|---|---|
| INVENTION SAMPLE 1 | FILM A | FILM A | Al0.72Cr0.25B0.03N | TiB2 | 0.3 | 0.2 | 0.8 | 3 | 66.3 | GOOD |
| INVENTION SAMPLE 2 | FILM B | FILM B | Al0.58Cr0.24B0.18CN | TiB2 | 0.2 | 0.3 | 1.3 | 5 | 68.5 | GOOD |
| INVENTION SAMPLE 3 | FILM B | FILM A | Al0.32Cr0.65B0.03CN | TiB2 | 0.1 | 0.1 | 0.2 | 2 | 50.8 | GOOD |
| INVENTION SAMPLE 4 | FILM B | FILM A | Al0.17Cr0.66B0.17CO | TiB2 | 0.2 | 0.4 | 0.6 | 2 | 52.4 | GOOD |
| INVENTION SAMPLE 5 | FILM B | FILM B | Al0.69Cr0.28B0.03CON | TiB2 | 5.0 | 5.0 | 10.0 | 2 | 70.4 | GOOD |
| INVENTION SAMPLE 6 | FILM A | FILM A | Al0.60Cr0.23B0.17ON | TiB2 | 0.2 | 0.9 | 6.6 | 12 | 72.3 | GOOD |
| INVENTION SAMPLE 7 | FILM B | FILM B | Al0.33Cr0.63B0.04N | TiB2 | 0.2 | 4.8 | 5.0 | 2 | 54.7 | GOOD |
| INVENTION SAMPLE 8 | FILM A | FILM A | Al0.16Cr0.66B0.18C | TiB2 | 0.4 | 4.3 | 5.1 | 3 | 56.2 | GOOD |
| INVENTION SAMPLE 9 | FILM A | FILM A | Al0.72Cr0.23B0.05CN | TiB2 | 0.3 | 0.2 | 3.8 | 15 | 74.9 | GOOD |
| INVENTION SAMPLE 10 | FILM A | FILM B | Al0.58Cr0.26B0.16CO | TiB2 | 1.5 | 0.1 | 6.4 | 8 | 76.2 | GOOD |
| INVENTION SAMPLE 11 | FILM B | FILM A | Al0.33Cr0.64B0.03CON | TiB2 | 1.1 | 0.1 | 4.8 | 8 | 58.4 | GOOD |
| INVENTION SAMPLE 12 | FILM B | FILM B | Al0.16Cr0.67B0.17ON | TiB2 | 1.5 | 0.1 | 4.9 | 7 | 60.3 | GOOD |
| INVENTION SAMPLE 13 | FILM A | FILM A | Al0.70Cr0.26B0.04N | TiB2 | 0.4 | 0.4 | 10.0 | 25 | 78.4 | GOOD |
| INVENTION SAMPLE 14 | FILM A | FILM B | Al0.59Cr0.25B0.16C | TiB2 | 0.1 | 0.1 | 10.0 | 100 | 80.4 | GOOD |
| INVENTION SAMPLE 15 | FILM A | FILM A | Al0.32Cr0.64B0.04CN | TiB2 | 0.2 | 0.1 | 8.6 | 57 | 62.7 | GOOD |
| INVENTION SAMPLE 16 | FILM B | FILM A | Al0.18Cr0.63B0.19CO | TiB2 | 0.1 | 0.1 | 7.8 | 78 | 64.8 | GOOD |
| PRIOR ART SAMPLE 1 | — | — | | TiB2 | — | — | 1.1 | 1 | 23.5 | NOT GOOD |
| PRIOR ART SAMPLE 2 | | | | TiB2 | — | — | 3.2 | 1 | 25.7 | NOT GOOD |
| PRIOR ART SAMPLE 3 | | | Al0.63Cr0.27B0.10N | | — | — | 2.1 | 1 | 29.5 | NOT GOOD |
| PRIOR ART SAMPLE 4 | | | Al0.54Cr0.36B0.10N | | — | — | 3.4 | 1 | 31.7 | NOT GOOD |
| COMPARATIVE SAMPLE 1 | FILM B | FILM A | Al0.68Cr0.32N | TiB2 | 0.8 | 0.8 | 4.8 | 6 | 33.8 | NOT GOOD |
| COMPARATIVE SAMPLE 2 | FILM B | FILM B | Al0.50Cr0.25B0.25C | TiB2 | 1.4 | 1.3 | 6.7 | 5 | 37.2 | NOT GOOD |
| COMPARATIVE SAMPLE 3 | FILM A | FILM A | Al0.75Cr0.14B0.11CN | TiB2 | 0.6 | 1.7 | 5.2 | 5 | 39.5 | NOT GOOD |
| COMPARATIVE SAMPLE 4 | FILM B | FILM B | Al0.11Cr0.76B0.13CO | TiB2 | 1.2 | 0.5 | 5.1 | 6 | 35.7 | NOT GOOD |
| COMPARATIVE SAMPLE 5 | FILM B | FILM A | Al0.44Cr0.44B0.12C | TiB2 | 7.2 | 3.9 | 15.0 | 3 | 43.2 | NOT GOOD |
| COMPARATIVE SAMPLE 6 | FILM B | FILM B | Al0.68Cr0.25O0.07CN | TiB2 | 2.7 | 6.4 | 9.1 | 2 | 41.9 | NOT GOOD |
| COMPARATIVE SAMPLE 7 | FILM A | FILM A | Al0.57Cr0.33B0.10CO | TiB2 | 2.8 | 6.2 | 11.8 | 3 | 45.3 | NOT GOOD |

REMARK 1: MILLING DISTANCE BEFORE 0.2mm WEAR OF RELIEF SURFACE
REMARK 2: GOOD EVALUATION IS MADE WHERE THE MILLING DISTANCE BEFORE 0.2mm WEAR OF RELIEF SURFACE IS AT LEAST 50m.

HARD LAMINAR COATING

TECHNICAL FIELD

The present invention relates to a hard laminar coating including two kinds of films having respective different compositions and alternately laminated on a surface of a base structure, and more particularly to an improvement of properties of the hard laminar coating.

BACKGROUND ART

Various hard laminar coatings including two kinds of films in the form of a first film and a second film having respective different compositions and alternately laminated on each other have been proposed, as a wear resistant hard laminar coating provided on a surface of a base structure of a tool of a high-speed tool steel or a cemented carbide. Patent Documents 1 and 2 disclose examples of such hard laminar coatings, wherein two kinds of films formed of metal elements belonging to the Groups IVa, Va and VIa of the Periodic Table of the Elements, or nitrides or carbides of Al, for example, are alternately laminated on each other with predetermined thicknesses of successive lamination. Namely, these hard laminar coatings are improved in the film hardness and wear resistance, owing to thickness reduction of the first and second films and increase of the number of lamination of the films, alloying of the metal elements, and various other means.

PRIOR ART DOCUMENTS

Patent Documents

Patent Document 1: JP-7-205361A
Patent Document 2: JP-2005-256081A

SUMMARY OF THE INVENTION

Object Achieved by the Invention

However, cutting tools provided with such hard laminar coatings do not exhibit sufficiently satisfactory properties in terms of their welding resistance and wear resistance, where the cutting tools are used to cut workpieces of heat resistant alloys such as Inconel (trademark of a nickel-based cemented carbide) and titanium alloys, or workpieces of composite materials including those heat resistant alloys. Thus, such cutting tools suffer from a drawback of a short service life due to a low degree of their wear resistance.

The present invention was made in view of the background art described above. It is therefore an object of the present invention to provide a hard laminar coating which has sufficiently high degrees of welding resistance and wear resistance where a cutting tool provided with the hard laminar coating is used to cut workpieces of heat resistant alloys such as Inconel and titanium alloys, or workpieces of composite materials including those heat resistant alloys.

Means for Achieving the Object

The present inventor, who made various studies in view of the above-described background art, found that a Ti-based hard laminar coating including boron (B) was satisfactory in terms of its high-temperature hardness and welding resistance, but was not sufficient in its wear resistance and bonding strength, while a Ti-based hard laminar coating including the alternately laminated first and second films one of which includes a carbide, a nitride, a carboxide, a nitroxide, a carbonitride or a carbo-oxynitride of an alloy of AlCr containing boron (B) and the other of which includes boron (B) was satisfactory in terms of its wear resistance and bonding strength (adhesion strength). The present invention was based on this finding.

That is, according to a first aspect of this invention, there is provided a hard laminar coating (a) consisting of a plurality of films including two kinds of films in the form of a first film and a second film having respective different compositions and alternately laminated on a surface of a base structure, characterized in that (b) the above-described first film is a carbide, a nitride, a carboxide, a nitroxide, a carbonitride or a carbo-oxynitride of $(Al_aCr_bB_c)$, (c) while the above-described second film is $TiB_2$.

According to a second aspect of the invention depending from the first aspect, (d) atomic ratios a, b and c in the above-described first film satisfy $a=1-b-c$, $0.2 \leq b \leq 0.7$, and $0 < c \leq 0.2$, and (e) a thickness of the above-described first film is no less than 0.1 μm and no more than 5.0 μm, (f) while a thickness of the above-described second film is no less than 0.1 μm and no more than 5.0 μm, (g) the above-described hard laminar coating having a total thickness of no less than 0.2 μm and no more than 10.0 μm.

According to a third aspect of the invention depending from the first or second aspect, (h) the above-described hard laminar coating consists of no less than 2 and no more than 100 layers, which are laminated on each other.

Advantages of the Invention

The hard laminar coating according to the first aspect of this invention is formed by alternately laminating the first film of the carbide, nitride, carboxide, a nitroxide, carbonitride or carbo-oxynitride of $(Al_aCr_bB_c)$, and the second film of $TiB_2$, on the surface of the base structure, so that the hard laminar coating has satisfactory high degrees of wear resistance and welding resistance.

According to the second aspect of the invention, the atomic ratios a, b and c of $(Al_aCr_bB_c)$ in the first film satisfy $a=1-b-c$, $0.2 \leq b \leq 0.7$, and $0 < c \leq 0.2$, and the thickness of the first film is no less than 0.1 μm and no more than 5.0 μm, while the thickness of the second film is no less than 0.1 μm and no more than 5.0 μm, the hard laminar coating having the total thickness of no less than 0.2 μm and no more than 10.0 μm, so that the hard laminar coating has satisfactory properties in terms of both of its wear resistance and welding resistance.

The hard laminar coating according to the third aspect of the invention, the number of the first and second films alternately laminated on each other is no less than 2 and no more than 100, so that the hard laminar coating has satisfactory properties in terms of both of its wear resistance and welding resistance.

The above-described hard laminar coating is preferably provided on a surface of various kinds of machining tools such as cutting tool bits and other non-rotary cutting tools, and rolling tools, as well as on a surface of at least a cutting portion of an end mill, a tapping tool, a drilling tool and other rotary cutting tools. However, the present hard laminar coating may be provided on a surface of various members other than the machining tools, as a protective coating on semiconductor devices, for example. The base structure such as the base structure of a tool, on which the hard laminar coating is provided, is preferably formed of a cemented carbide or a high-speed tool steel, but may be formed of any other metallic material.

The hard laminar coating is preferably formed by a PVD process (physical vapor deposition process), such as an arc ion plating process and a sputtering process. The thicknesses of the first and second films can be suitably controlled by adjusting amounts of electric power to be applied to targets and/or rotational speed of a rotary table, for instance.

The atomic ratios a, b and c of $(Al_aCr_bB_c)$ of the above-described first film are preferably selected so as to satisfy $a=1-b-c$, $0.2 \leq b \leq 0.7$, and $0 < c \leq 0.2$. The atomic ratios a, b and c can be determined according to a metallic material or required properties. If the atomic ratio b is less than 0.2 or the atomic ratio c is zero, or if the atomic ratio b is more than 0.7 or the atomic ratio c is more than 0.2, the hard laminar coating cannot exhibit a satisfactory degree of wear resistance. The first film may be any one of a carbide, a nitride, a carboxide, a nitroxide, a carbonitride or a carbo-oxynitride of $(Al_aCr_bB_c)$.

The above-described first and second films may include inevitably contained impurity elements or other elements not influencing the properties of the hard laminar coating, other than the carbide, nitride, carboxide, nitroxide, carbonitride and carbo-oxynitride of $(Al_aCr_bB_c)$, and $TiB_2$.

Preferably, the above-described first film has the thickness of no less than 0.1 μm and no more than 5.0 μm, while the second film has the thickness of no less than 0.1 μm and no more than 5.0 μm, and the hard laminar coating has the total thickness of no less than 0.2 μm and no more than 10.0 μm. If the thickness of the first or second film is less than 0.1 μm or if the total thickness of the hard laminar coating is less than 0.2 μm, the hard laminar coating is not satisfactory in terms of at least the wear resistance. If the thickness of the first or second film is more than 0.5 μm or if the total thickness of the hard laminar coating is more than 10.0 μm, the cost of manufacture of the hard laminar coating is unacceptably high.

Preferably, the number of the first and second films alternately laminated on each other is no less than 2 and no more than 100. If the number of the films is less than 2, the hard laminar coating does not include the first film or the second film, and is not satisfactory in terms of its wear resistance. If the number of the first and second films is more than 100, the cost of manufacture of the hard laminar coating is accordingly increased.

Either the first film or the second film may be formed first in contact with the surface of the base structure (of a tool, for example), depending upon the compositions of the first and second films. For example, one of the first and second films which has a higher degree of bonding strength is formed in contact with the base structure. However, the first or second film may be formed in contact with the base structure, irrespective of their compositions. The first and second films may be alternately laminated on each other as a pair or a plurality of successive pairs, but an odd total number of the first and second films may be laminated on each other such that the first film is formed as the lowermost and uppermost layers, or the second film is formed as the lowermost and uppermost layers. It is noted that a hard film other than the first and second films may be interposed between the surface of the base structure and the present hard laminar coating, as needed, and another film may be formed on the uppermost layer.

BRIEF DESCRIPTION OF THE DRAWINGS

FIG. 9 is a view indicating composition, thickness, number of the films and evaluated wear resistance of the hard laminar coatings formed on a surface of the cutting portion of an end mill identical with that of FIG. 1 except in that the present end mill is of a two-cutting-edges type, as compared with those of comparative samples not satisfying the numerical requirements of the present invention and prior art samples wherein the hard laminar coating includes only one kind of film.

MODE FOR CARRYING OUT THE INVENTION

Figure 1:
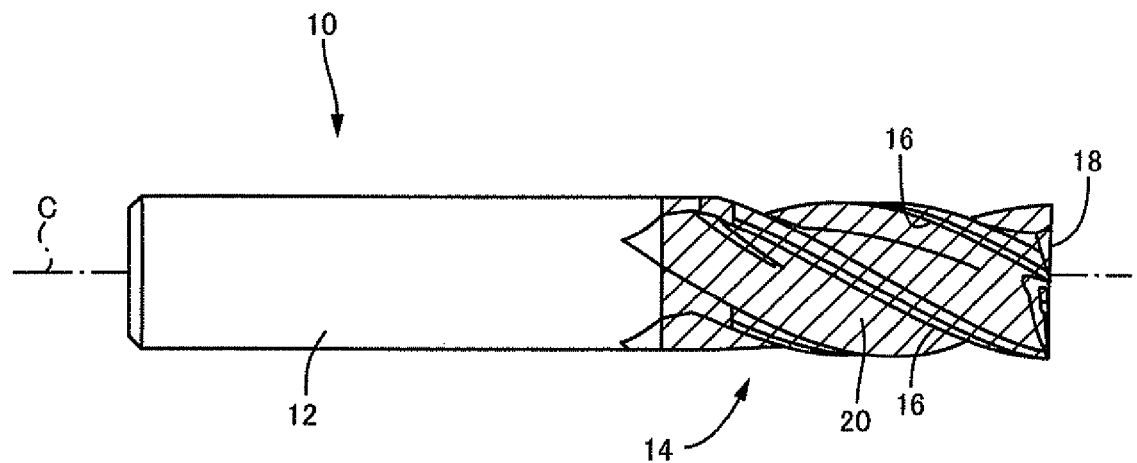
FIG. 1 is a view showing an end mill to which a hard laminar coating of the present invention is applicable, the view being a front elevational view as seen in a direction perpendicular to an axis of the end mill.

Referring to the drawings, embodiments of the present invention will be described in detail.

First Embodiment

FIG. 1 is the view showing an end mill 10 which is an example of a tool to which a hard laminar coating of the present invention is applicable, the view being a front elevational view as seen in a direction perpendicular to an axis C of the end mill 10. This end mill 10 has a tool base structure 12 formed of a cemented carbide and consisting of a shank and a cutting portion 14. The cutting portion 14 has integrally formed helical peripheral cutting edges 16 and a linear end cutting edge 18 as cutting edges. The cutting portion 14 is rotated about the axis C to perform a cutting operation with the peripheral cutting edges 16 and end cutting edge 18, and is coated on its surface with a hard laminar coating 20. A hatched area in FIG. 1 shows the hard laminar coating 20.

Figure 2:
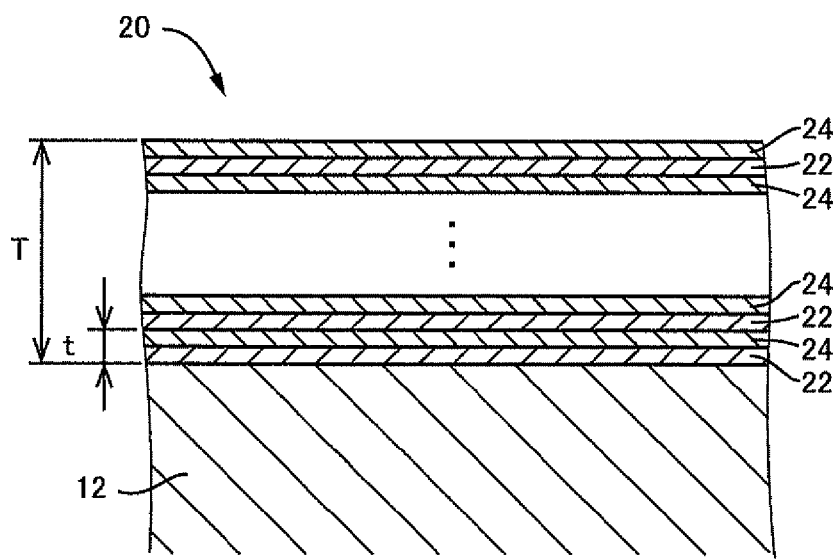
FIG. 2 is a view showing the end mill of FIG. 1, the view being a cross sectional view showing in enlargement the hard laminar coating provided on a surface of a cutting portion of the end mill.

FIG. 2 is the cross sectional view showing in enlargement structure of the hard laminar coating 20 provided on the surface of the cutting portion 14. The end mill 10 is a rotary cutting tool, and the tool base structure 12 corresponds to a base body having a surface on which the hard laminar coating 20 is provided.

As is apparent from FIG. 2, the hard laminar coating 20 consists of a multiplicity of layers formed on a surface of the tool base structure 12 by alternately laminating a first film 22 and a second film 24 of respective different compositions on each other. The first film 22 is formed of a carbide, a nitride, a carboxide, a nitroxide, a carbonitride or a carbo-oxynitride of an alloy of $(Al_aCr_bB_c)$. The atomic ratios a, b and c of the alloy of $(Al_aCr_bB_c)$ satisfy $a=1-b-c$, $0.2 \leq b \leq 0.7$, and $0 < c \leq 0.2$. Namely, the atomic ratio b is no less than 0.2 and no more than 0.7, while the atomic ratio c is more than 0 and no more than 0.2. Further, the thickness of the first film 22 is no less than 0.1 μm and no more than 5.0 μm. The second film 24 is formed of an alloy of TiB$_2$. The thickness of the second film 24 is no less than 0.1 μm and no more than 5.0 μm. The hard laminar coating 20 including the alternately laminated first and second films 22, 24 consists of no less than 2 and no more than 100 layers, and has a thickness of no less than 0.2 μm and no more than 10.0 μm.

Figure 3:
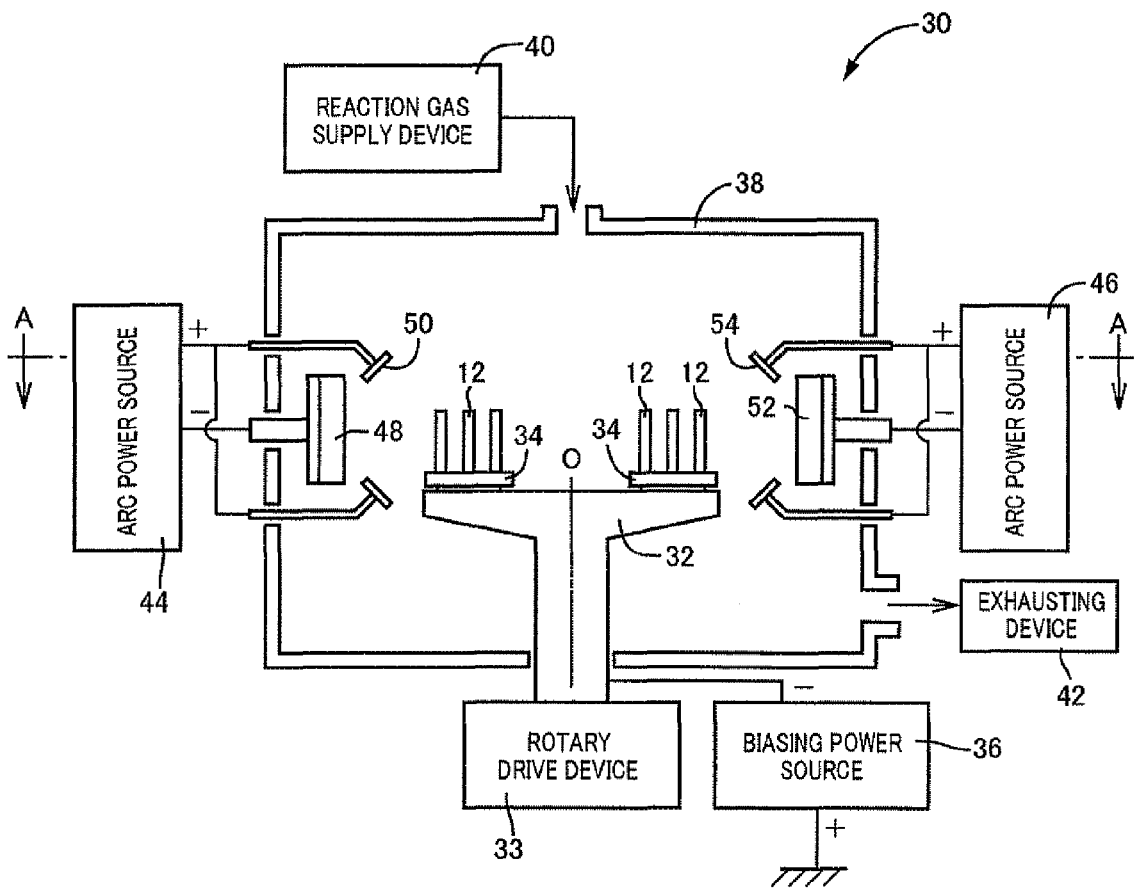
FIG. 3 is a schematic view showing an example of an arc ion plating device configured to suitably form the hard laminar coating of FIG. 1 in a PVD process.
Figure 4:
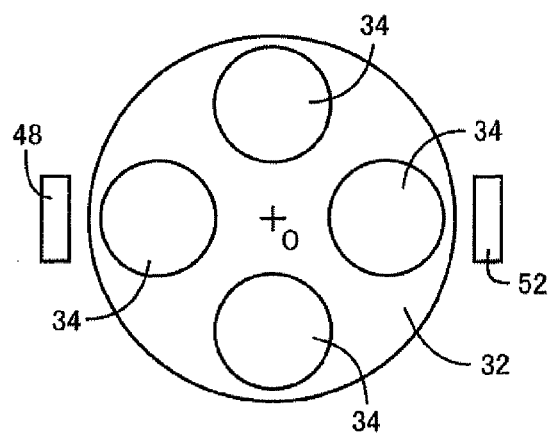
FIG. 4 is a plane view for explaining a positional relationship between a rotary table and targets of the arc ion plating device of FIG. 3.

FIG. 3 is the schematic view showing an arc ion plating device 30 suitably used to form the above-described hard laminar coating 20. FIG. 4 is the plane view taken along lines A-A of FIG. 3. This arc ion plating device 30 is provided with: a first rotary table 32 having a substantially horizontal support surface; a rotary drive device 33 for rotating the first rotary table 32 about a substantially vertical axis O; a plurality of (four in the example of FIG. 4) second rotary tables 34 disposed in a radially outer portion of the first rotary table 32 and holding a multiplicity of workpieces in the form of the tool base structures 12 having the cutting edges 16, 18 to be coated with the hard laminar coating 20; a biasing power source 36 for applying a negative bias voltage to the tool base structures 12; a chamber 38 serving as a processing container accommodating therein the tool base structures 12, etc.; a reaction gas supply device 40 for supplying a suitable reaction gas into the chamber 38; an exhausting device 42 provided with a vacuum pump for exhausting a gas out of the chamber 38, and thereby reducing the pressure within the chamber 38; a first arc power source 44; a second arc power source 46; etc. The arc ion plating device 30 corresponds to a coating forming device. It is noted that the tool base structures 12 held by the second rotary tables 34 are not shown in FIG. 4.

The above-described second rotary tables 34 are disposed in parallel to the first rotary table 32, such that each of the second rotary tables 34 is rotated about its axis (second axis) which is parallel to the axis O of the first rotary table 32. Each second rotary table 34 holds a plurality of the tool base structures 12 such that each tool base structure 12 stands upright with its axis being parallel to the above-indicated second axis and with its cutting portion 14 being located on its upper side, so that each of the tool base structures 12 is rotated about the axis of the second rotary table 34 (about the second axis) while at the same time rotated about the axis O of the first rotary table 32. Around the first rotary table 32, there are fixedly disposed a first target 48 and a second target 52, which are spaced apart from each other by 180° about the axis O. As the first rotary table 32 is continuously rotated, the tool base structures 12 are moved cyclically and alternately in front of the first and second targets 48, 52, together with the second rotary tables 34. In the present embodiment, the two targets in the form of the first and second targets 48, 52 are disposed in the 180° spaced-apart relationship with each other about the axis O. While the present embodiment is configured such that the plurality of second rotary tables 34 are rotated by respective rotary drive devices independently of the rotation of the first rotary table 32, the second rotary tables 34 may be mechanically connected through a gear or other mechanism to the first rotary table 32 so that the second rotary tables 34 are rotated in synchronization with the rotation of the first rotary table 32.

The above-indicated reaction gas supply device 40 is provided with reservoirs storing a nitrogen (N$_2$) gas, a hydrocarbon (CH$_4$, C$_2$H$_2$, etc.) gas, an oxygen (O$_2$) gas, etc., and supplies the appropriate gas or gases depending upon the compositions of the first and second films 22, 24 to be formed. For example, only the oxygen gas is supplied to form an oxide, or only the nitrogen gas is supplied to form a nitride. Further, only the hydrocarbon gas is supplied to form a carbide, or the oxygen gas and the hydrocarbon gas are supplied to form a carboxide. Further, the nitrogen gas and the oxygen gas are supplied to form an oxynitride, or the nitrogen gas and the hydrocarbon gas are supplied to form a carbonitride. The oxygen gas, the nitrogen gas and the hydrocarbon gas are supplied to form a carbo-oxynitride. The appropriate gases are supplied to form other compounds such as a boride, an oxynitride or a boronitride.

The first target 48 disposed to face the above-indicated axis O is formed of an alloy of $(Al_aCr_bB_c)$ which provides the components of the first film 22, while the second target 52 also disposed to face the axis O is formed of an alloy of TiB$_2$ which provides the components of the second film 24. The above-indicated first arc power source 44 applies a predetermined arc current between a cathode in the form of the above-indicated first target 48 and an anode 50, to perform an arc discharge for vaporizing the alloy of $(Al_aCr_bB_c)$ from the first target 48 so that the vaporized alloy of $(Al_aCr_bB_c)$ is deposited as positive (+) metal ions on the tool base structures 12 to which the negative bias voltage is applied. At this time, the vaporized alloy of $(Al_aCr_bB_c)$ reacts with the supplied reaction gas or gases, to form a carbide, a nitride, a carboxide, a nitroxide, a carbonitride or a carbo-oxynitride of $(Al_aCr_bB_c)$ for thereby forming the first film 22. The above-indicated second arc power source 46 applies a predetermined arc current between a cathode in the form of the above-indicated second target 52 and an anode 54, to perform an arc discharge for vaporizing the alloy of TiB$_2$ from the second target 52 so that the vaporized alloy of TiB$_2$ is deposited as positive (+) metal ions on the tool base structures 12 to which the negative bias voltage is applied.

When the hard laminar coating 20 is formed on the surface of the cutting portion 14 of each tool base structure 12, by using the arc ion plating device 30 constructed as described above, the predetermined reaction gas or gases is/are supplied from the reaction gas supply device 40 while the pressure within the chamber 38 is held at a predetermined level (e.g. within a range between about 1.33 Pa and about 3.99 Pa) by the operation of the exhausting device 42, and the predetermined bias voltage (e.g. within a range between about −50V and about −150V) is applied from the bias power source 36 to the tool base structures 12. At the same time, the first rotary table 32 is continuously rotated about the axis O in one direction at a constant speed while the second rotary tables 34 are rotated about their axes, so that the tool base structures 12 are moved cyclically and alternately in front of the first and second targets 48, 52, together with the second rotary tables 34, while the tool base structures 12 are rotated about the second axis.

The first film 22 formed of a carbide, a nitride, a carboxide, a nitroxide, a carbonitride or a carbo-oxynitride of $(Al_aCr_bB_c)$ is deposited on the surface of the tool base structure 12 when the tool base structure 12 is moved in front of the first target 48, while the second film 24 formed of TiB$_2$ is deposited on the surface of the tool base structure 12 when the tool base structure 12 is moved in front of the second target 52. Thus, the first film 22 and the second film 24 are alternately and repeatedly laminated on the surface of the tool base structure 12, to form the hard laminar coating 20. In the present embodiment, the first and second targets 48, 52 are disposed around the first rotary table 32, so that the first film 22 and the second film 24 are laminated on each other during rotation of the first rotary table 32. The amounts of the arc current applied from the respective arc power sources 44, 46 are determined according to the thicknesses of the first and second films 22, 24 to be formed. The formation of this hard laminar coating 20 can be automatically controlled by a control device including a computer.

Since the first film 22 is formed of a carbide, a nitride, a carboxide, a nitroxide, a carbonitride or a carbo-oxynitride of the alloy of $(Al_aCr_bB_c)$ while the second film 24 is formed of $TiB_2$, the first and second films 22, 24 must be formed independently of each other, so that the reaction gas or gases to be supplied from the reaction gas supply device 40 is/are changed, and the first and second arc power sources 44, 46 are selectively turned on and off to selectively turn on and off the first and second targets 48, 52.

Second Embodiment

Figure 5:
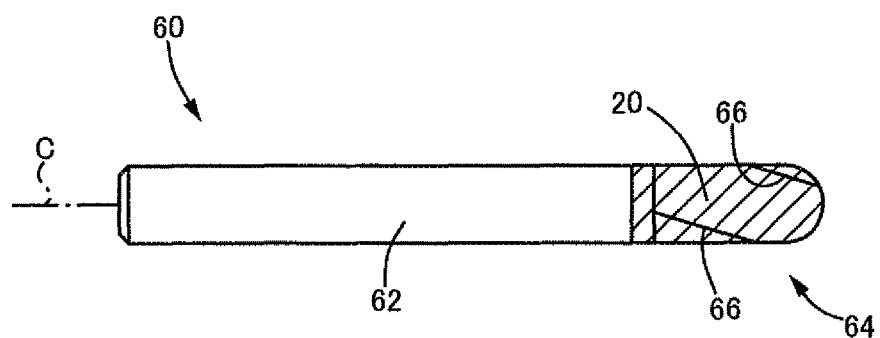
FIG. 5 is a front elevational view of a ball end mill to which the hard laminar coating of the present invention is applicable, as seen in the direction perpendicular to the axis of the ball end mill.
Figure 6:
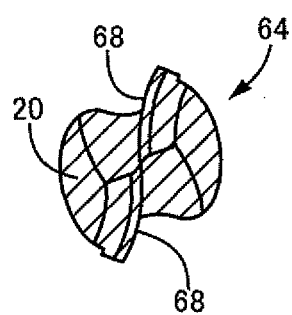
FIG. 6 is an end view of the cutting portion of the ball end mill of FIG. 5, as seen in the axial direction of the ball end mill.

FIG. 5 is the front elevational view of a ball end mill 60 having a cutting portion 64 on which the hard laminar coating 20 is formed in a process similar to that for the end mill 10 in the first embodiment, as seen in the direction perpendicular to the axis C of the ball end mill 60, and FIG. 6 is the end view of the cutting portion 64 of the ball end mill 60 as seen in its axial direction. This ball end mill 60 has a tool base structure 62 formed of a cemented carbide and consisting of a shank and the cutting portion 64. The cutting portion 64 has integrally formed helical peripheral cutting edges 66 and two semicircular ball (end) cutting edges 68 as cutting edges. The cutting portion 64 is rotated about the axis to perform a cutting operation with the peripheral cutting edges 66 and ball cutting edges 68, and is coated on its surface with the hard laminar coating 20 as shown in FIG. 2. Hatched areas in FIGS. 5 and 6 show the hard laminar coating 20.

Third Embodiment

Figure 7:
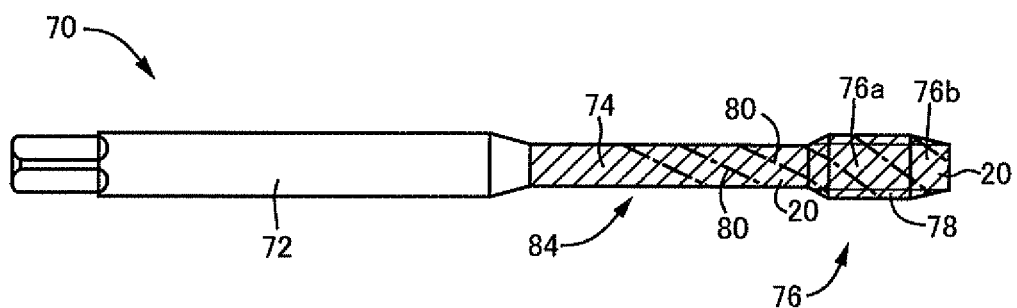
FIG. 7 is a front elevational view of a tap to which the hard laminar coating of the present invention is applicable, as seen in a direction perpendicular to the axis of the tap.
Figure 8:
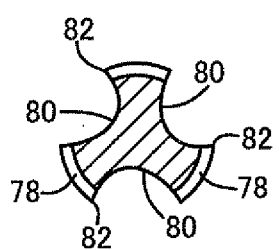
FIG. 8 is a perspective view showing a cutting portion of the tap of FIG. 7.

FIG. 7 is the front elevational view of a tap 70 having a cutting portion 76 on which the above-described hard laminar coating 20 is formed in a process similar to that for the end mill 10 in the first embodiment, as seen in a direction perpendicular to the axis C of the tap 70, and FIG. 8 is the cross sectional view showing the cutting portion 76 as seen in a direction of the axis C. For example, this tap 70 is a spiral-flute tap having three spiral flutes 80 formed integrally with a tool base structure 84 of a cemented carbide having shaft like form. Namely, the tool base structure 84 has a shank 72 to be held by main spindle, a neck portion 74 and the cutting portion 76, which are formed in this order of description in the axial direction. The cutting portion 76 has an external thread 78 which is divided into segments by the spiral flutes 80, so as to form cutting edges 82 along the spiral flutes 80. The cutting portion 76 is formed with a complete thread portion 76a consisting of a complete thread, and a chamfered portion 76b having a thread diameter continuously decreasing in the axial direction toward the axial end. The cutting portion 76 is coated on its surface with the hard laminar coating 20 shown in FIG. 2. A hatched area in FIG. 7 shows the hard laminar coating 20.

A plurality of different kinds of test samples of an end mill identical with that of FIG. 1 except in that the present end mill of a two-cutting-edges type were manufactured by coating the surface of its cutting portion with the respective hard laminar coatings having respective different combinations of the compositions, thicknesses and number of lamination of the films, as indicated in FIG. 9. Test end milling operations were performed with the test sample end mills under the following end milling conditions, and the test sample end mills were evaluated on the basis of a distance of the end milling operation performed by the test sample end mills. Results of the evaluation are also indicated in FIG. 9. In FIG. 9, film A corresponds to the first film 22, while film B corresponds to the second film 24. The last characters "N", "C", "CO", "NO", "CN" and "CON" of the representation of the composition of the film A respectively indicate a nitride, a carbide, a carboxide, a nitroxide, a carbonitride and a carbo-oxynitride. The milling distance indicated in FIG. 9 is the distance of the end milling operation that could be performed by the end mill of each test sample before 0.2 mm wear of the relief surface adjacent to the end cutting edge 18 was recognized. The wear resistance of each test sample end mill was evaluated depending upon the milling distance, and "Good" evaluation was made where the milling distance is more than 50 m.

<Conditions of Test Milling Operations>

End mill: Cemented carbide two-cutting-edges end mill (φ6 mm) coated with the hard laminar coating Workpiece: Inconel 718 (trademark of a nickel-based cemented carbide)

Machine tool used: Vertical machining center

Cutting speed: 29 m/min.

Feed rate: 0.02 mm/cutting edge

Milling depth: 0.3 mm

Cutting fluid: Oil

In the above-described cutting operations, all of the test sample end mills coated with the hard laminar coatings 20 each including the alternately laminated first and second films 22, 24 exhibited satisfactory properties in terms of welding resistance, heat resistance and bonding strength, but these test sample end mills exhibited different degrees of wear resistance, as indicated in FIG. 9. Namely, in FIG. 9 "Invention Samples 1-16" which are the end mills coated with the hard laminar coating 20 including the alternately laminated first and second films 22, 24 were given "good" evaluation of the wear resistance, and "Comparative Samples 1-7" which are also the end mills coated with the hard laminar coating 20 were given "not good" evaluation of the wear resistance. "Prior Art Samples 1-4" are end mills coated with respective hard laminar coatings each using only one kind of film.

In each of the "Invention Samples 1-16" given the "good" evaluation of the wear resistance, the hard laminar coating 20 covering its cutting portion includes the first film 22 (film A) formed of a carbide, a nitride, a carboxide, a nitroxide, a carbonitride or a carbo-oxynitride of the alloy of $(Al_aCr_bB_c)$ and the second film 24 (film B), which are alternately laminated on each other. Further, the atomic ratios a, b and c of the alloy of $(Al_aCr_bB_c)$ satisfy a=1−b−c, 0.2≤b≤0.7, and 0<c≤0.2. Further, the thickness of the first film 22 is no less than 0.1 μm and no more than 5.0 μm. The second film 24 is formed of the alloy of $TiB_2$, and the thickness of the second film 24 is no less than 0.1 μm and no more than 5.0 μm. The number of the first and second films 22, 24 alternately laminated on each other to form the hard laminar coating 20 is no less than 2 and no more than 100, and the hard laminar coating 20 has the thickness of no less than 0.2 μm and no more than 10.0 μm. All of these "Invention Samples 1-16" were given the "good" evaluation of the wear resistance, irrespective of whether the first film 22 (film A) or the second film 24 (film B) is the lowermost layer, or the uppermost layer, as indicated in FIG. 9.

On the other hand, the "Comparative Samples 1-7" were given the "not good" evaluation of the wear resistance. These samples were also coated with the hard laminar coatings 20 each of which includes the alternately laminated with first and second films 22, 24 at the cutting edges and wherein the first film 22 is formed of a carbide, a nitride, a carboxide, a nitroxide, a carbonitride or a carbo-oxynitride of the alloy of $(Al_aCr_bB_c)$ or $(Al_{1-a}Cr_a)$ while the second film 24 is formed of $TiB_2$. However, any of the atoms, the atomic ratio a, the film thicknesses and the number of the films alternately laminated on each other is outside a corresponding one of the ranges of the present invention described above. Further, the "Prior Art Samples 1-4" wherein the hard laminar coating uses only one kind of film exhibited considerably low degrees of wear resistance, and also failed to exhibit satisfactory properties in terms of at least one of its welding resistance, heat resistance and bonding strength that is not shown in FIG. 9.

The illustrated embodiments described above are configured such that the hard laminar coating 20 includes the first film 22 of a carbide, a nitride, a carboxide, a nitroxide, a carbonitride or a carbo-oxynitride of the alloy of $(Al_aCr_bB_c)$ and the second film 24 formed of the alloy of $TiB_2$, which are alternately laminated on a surface of the base structure 12, 62, 84, so that the hard laminar coating 20 has satisfactory properties in terms of all of its wear resistance, heat resistance, welding resistance, and bonding strength (adhesion strength).

The illustrated embodiments are further configured such that the atomic ratios a, b and c of the alloy of $(Al_aCr_bB_c)$ of the first film 22 formed of its carbide, nitride, carboxide, nitroxide, carbonitride or carbo-oxynitride satisfy a=1−b−c, 0.2≤b≤0.7, and 0<c≤0.2, and the thickness of the first film 22 is no less than 0.1 μm and no more than 5.0 μm, while the thickness of the second film 24 is no less than 0.1 μm and no more than 5.0 μm, the hard laminar coating 20 having the total thickness of no less than 0.2 μm and no more than 10.0 μm, so that the hard laminar coating 20 has satisfactory properties in terms of all of its wear resistance, heat resistance, welding resistance, and bonding strength (adhesion strength).

The illustrated embodiments are also configured such that the number of the first and second films 22, 24 of the hard laminar coating 20 alternately laminated on each other is no less than 2 and no more than 100, so that the hard laminar coating 20 has satisfactory properties in terms of all of its wear resistance, heat resistance, welding resistance and bonding strength (adhesion strength).

While the embodiments of the present invention have been described above in detail by reference to the drawings, for illustrative purpose only, it is to be understood that the present invention may be embodied with various changes and improvements, which may occur to those skilled in the art.

Industrial Utility

The hard laminar coating 20 according to the present invention includes the first film 22 formed of a carbide, a nitride, a carboxide, a nitroxide, a carbonitride or a carbo-oxynitride of the alloy of $(Al_aCr_bB_c)$ and the second film 24 formed of $TiB_2$, which are alternately laminated on a surface of the base structure 12, 62, 84, so that the hard laminar coating 20 has satisfactory properties in terms of all of its wear resistance, heat resistance, welding resistance, and bonding strength (adhesion strength). The hard laminar coating 20 having the particularly improved wear resistance can be suitably used as a hard coating for rotary cutting tools, etc.

Nomenclature Of Reference Signs

10: End mill (Cutting tool provided with a hard laminar coating)

12, 62, 84: Base structure of tools

20: Hard laminar coating

22: First film

24: Second film

60: Ball end mill (Cutting tool provided with a hard laminar coating)

70: Tap (Cutting tool provided with a hard laminar coating)

The invention claimed is:

1. A hard laminar coating consisting of a plurality of films including two kinds of films in the form of a first film and a second film having respective different compositions and alternately laminated on a surface of a base structure, wherein said first film is a carbide, a nitride, a carboxide, a nitroxide, a carbonitride or a carbo-oxynitride of $(Al_aCr_bB_C)$, while said second film is $TiB_2$, said hard laminar coating configured to include atomic ratios a, b and c in said first film satisfying a=1−b−c, 0.2≤b≤0.7, and 0<c≤0.2, and a thickness of said first film being no less than 0.1 μm and no more than 5.0 μm, while a thickness of said second film being no less than 0.1 μm and no more than 5.0 μm, and to have a total thickness of no less than 0.2 μm and no more than 10.0 μm, and said hard laminar coating consists of no less than 2 and no more than 100 layers, which are laminated on each other.

* * * * *